(12) United States Patent
Chen et al.

(10) Patent No.: US 10,679,999 B2
(45) Date of Patent: Jun. 9, 2020

(54) CAPACITOR-COUPLED N-TYPE TRANSISTOR-BASED ONE-TIME PROGRAMMABLE DEVICE

(71) Applicant: Shanghai Huahong Grace Semiconductor Manufacturing Corporation, Shanghai (CN)

(72) Inventors: Yu Chen, Shanghai (CN); Yuan Yuan, Shanghai (CN); Hualun Chen, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/202,636

(22) Filed: Nov. 28, 2018

(65) Prior Publication Data

US 2020/0020706 A1    Jan. 16, 2020

(30) Foreign Application Priority Data

Jul. 11, 2018 (CN) .......................... 2018 1 0757171

(51) Int. Cl.
| | |
|---|---|
| H01L 27/112 | (2006.01) |
| H01L 21/265 | (2006.01) |
| H01L 23/525 | (2006.01) |
| H01L 49/02 | (2006.01) |
| H01L 29/06 | (2006.01) |

(52) U.S. Cl.
CPC .. *H01L 27/11206* (2013.01); *H01L 21/26586* (2013.01); *H01L 23/5256* (2013.01); *H01L 28/60* (2013.01); *H01L 29/0649* (2013.01)

(58) Field of Classification Search
CPC ......... H01L 27/11206; H01L 21/26586; H01L 23/5256; H01L 28/60; H01L 29/0649
USPC .......................................................... 257/300
See application file for complete search history.

(56) References Cited

U.S. PATENT DOCUMENTS

| | | | |
|---|---|---|---|
| 2003/0232284 A1* | 12/2003 | Liu ................. | H01L 21/823418 430/314 |
| 2013/0107635 A1* | 5/2013 | Fisch ..................... | G11C 16/00 365/185.33 |
| 2018/0083008 A1* | 3/2018 | Guo ........................ | H01L 28/40 |

* cited by examiner

*Primary Examiner* — Tu-Tu V Ho
(74) *Attorney, Agent, or Firm* — Murtha Cullina LLP

(57) ABSTRACT

A capacitor-coupled N-type transistor-based one-time programmable (OTP) device is disclosed. The OTP includes a transistor and a coupling capacitor both formed in a p-well and isolated from each other by field oxide or shallow trench isolation (STI). The transistor is constructed of a gate, a source region and a drain region composed of heavily-doped N-region. The coupling capacitor has a top plat formed of polysilicon on substrate surface, and a bottom plate constructed of an NLDD region and a heavily-doped N-region in the NLDD region. In order to achieve maximum capacitance utilization, the top plate of the coupling capacitor has a width not greater than the NLDD implantation region or twice a lateral junction depth of the heavily-doped n-region. The gate of the transistor may not be wider than the top plate of the coupling capacitor such that capacitance coupling ratio of the coupling capacitor to the transistor is optimized.

7 Claims, 3 Drawing Sheets

CAPACITOR-COUPLED N-TYPE TRANSISTOR-BASED ONE-TIME PROGRAMMABLE DEVICE

CROSS-REFERENCE TO RELATED APPLICATION

This application claims the priority of Chinese patent application number 201810757171.7, filed on Jul. 11, 2018, the entire contents of which are incorporated herein by reference.

TECHNICAL FIELD

The present invention relates to the field of semiconductor devices and, in particular, to a capacitor-coupled N-type transistor-based one-time programmable (OTP) device.

BACKGROUND

Existing capacitor-coupled N-type transistor-based OTP devices can be categorized primarily into the following three types.

The first type of OTP device is shown in FIG. 1, which includes a transistor (depicted on the left) and a capacitor (depicted on the right). The transistor is formed in a P-well and has NLDD structures. The capacitor is in an N-well and has a PLDD structure. Source and drain doping of such a transistor is the same as that for an ordinary NMOS transistor. The capacitor has a bottom plate consisting of the N-well as well as of a heavily-doped P-region. This OTP device is, however, disadvantageous in that: since the transistor is sized at approximately 80% of an ordinary device, but has the same source and drain doping as an ordinary device, its efficiency and time window for hot carrier writing are limited. Moreover, the capacitor must have a relatively large area due to the size of the N-well of its bottom plate.

The second type of OTP device is shown in FIG. 2, which includes a transistor (depicted on the left) and a capacitor (depicted on the right), both formed in the same P-well. The transistor has NLDD structures, and the capacitor has a bulky N-doped region. Similarly, source and drain doping of the transistor is the same as that for an ordinary NMOS transistor. Additionally, the capacitor has a bottom plate formed by an additional N-type implantation. This OTP device is, however, disadvantageous in that: since the transistor is sized at approximately 80% of an ordinary device, but has the same source and drain doping as an ordinary device, its efficiency and time window for hot carrier writing are limited. Moreover, it requires an additional N-type implantation.

The third type of OTP device is shown in FIG. 3, which includes a transistor (depicted on the left) and a capacitor (depicted on the right), both formed in the same P-well. Each of the transistor and the capacitor has NLDD structure(s). Similarly, source and drain doping of the transistor is the same as that for an ordinary NMOS transistor. The capacitor has a bottom plate formed by a heavily-doped N-region stacked with a coupling capacitor. This OTP device is, however, disadvantageous in that: since the transistor is sized at approximately 80% of an ordinary device, but has the same source and drain doping as, an ordinary device, its efficiency and time window for hot carrier writing are limited. Moreover, the capacitor has a low coupling ratio and a large area.

SUMMARY OF THE INVENTION

It is an object of the present invention to provide a capacitor-coupled N-type transistor-based one-time programmable (OTP) device This object is attained by a capacitor-coupled N-type transistor-based OTP device according to the present invention, comprising a transistor and a coupling capacitor both located in a P-well and isolated from each other by a field oxide or a shallow trench isolation (STI), the transistor comprising a gate, a source region, and a drain region, the source and drain regions each composed of a heavily-doped N-region, the coupling capacitor having a top plate formed by a polysilicon on a substrate surface, and a bottom plate formed by an NLDD implantation region and a heavily-doped N-region in the NLDD implantation region.

Additionally, the gate of the transistor and the top plate of the coupling capacitor may be formed by etching the same polysilicon layer.

Additionally, the bottom plate may either be independently dedicated to the coupling capacitor of each cell or an active region of coupling capacitors of multiple cells may be joined.

Additionally, the top plate of the coupling capacitor may have a width not greater than twice an overlapping lateral width of the NLDD implantation region and an overlying gate so that a capacitance utilization efficiency is maximized.

Additionally, the gate of the transistor may have a width not greater than a width of the top plate of the coupling capacitor such that a capacitance coupling ratio of the coupling capacitor to the transistor is optimized.

Additionally, an ion-implantation process for forming the heavily-doped N-region may comprise an implantation of N-type ions conducted at an inclination angle of 15 to 45 degrees to form an effective connection between the source and the drain as well as to optimize a hot carrier writing efficiency.

In the capacitor-coupled N-type transistor-based OTP device of the present invention, the bottom plate of the coupling capacitor is formed by an NLDD region and a heavily-doped n-region, and may either be independently dedicated to the coupling capacitor of each cell or common to coupling capacitors in multiple cells. The doped source and drain do not contain an NLDD region. In the OTP device of the present invention, the width of the polysilicon gate in the coupling capacitor and the transistor is reduced to about half that of an ordinary MOS device produced by the same process, resulting in area shrinkage of corresponding memory cells, while not requiring any additional photolithography step.

DETAILED DESCRIPTION

Figure 1:
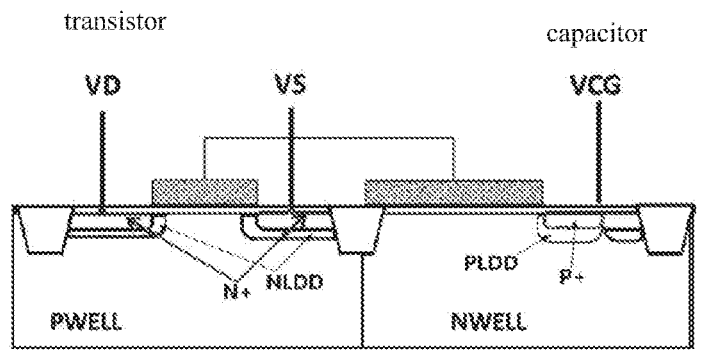
FIGS. 1 to 3 are conventional capacitor-coupled N-type transistor-based OTP devices of three distinct structures.
Figure 2:
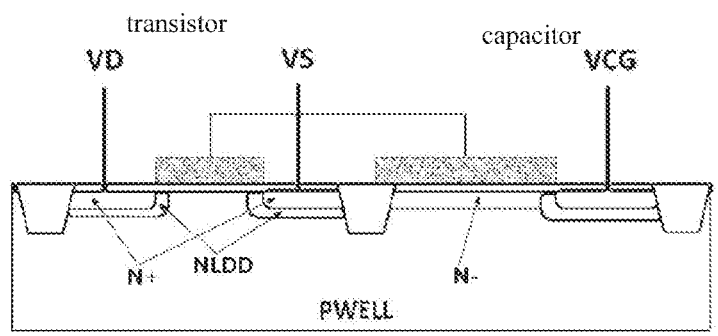
Figure 3:
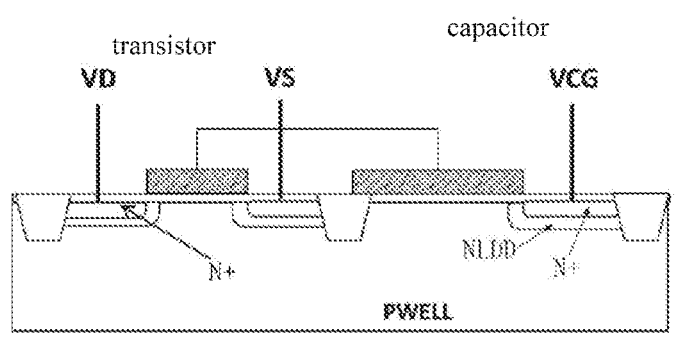
Figure 4:
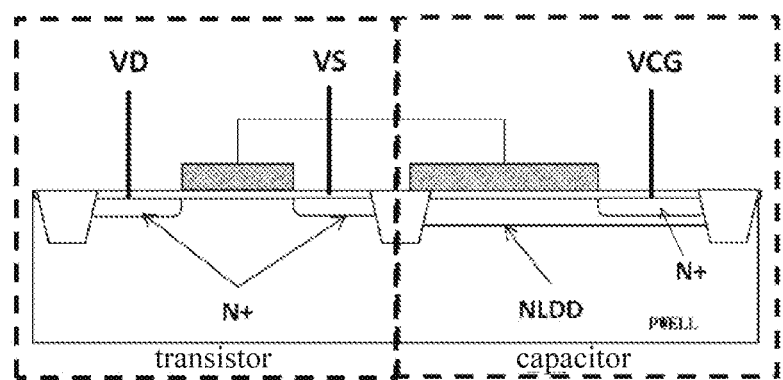
FIG. 4 is a schematic diagram of a capacitor-coupled N-type transistor-based OTP device constructed in accordance with the present invention.

As shown in FIG. 4, a capacitor-coupled N-type transistor-based one-time programmable (OTP) device embodying the present invention includes a transistor and a coupling capacitor, both located in a P-well. The transistor is isolated from the coupling capacitor by a field oxide or a shallow trench isolation (STI) (as in the case of FIG. 4). The transistor is comprised of a gate G a source region S and a drain region D. Each of the source and drain regions is formed of a heavily-doped N-region. A top plate of the coupling capacitor is formed of a polysilicon on a substrate surface. A bottom plate of the coupling capacitor is formed of an N-type lightly-doped drain (NLDD) implantation region and a heavily-doped N-region in the NLDD region. The NLDD region may laterally extend from the STI to another adjacent STI such that the NLDD region substantially spans the whole lateral width of the top plate. In case of an array of such OTP devices formed in the substrate, in every adjacent two devices in the array, active regions of the coupling capacitors may be either joined together or independent from each other.

The gate of the transistor and the top plate of the coupling capacitor may be formed by etching the same single layer of polysilicon.

Figure 5:
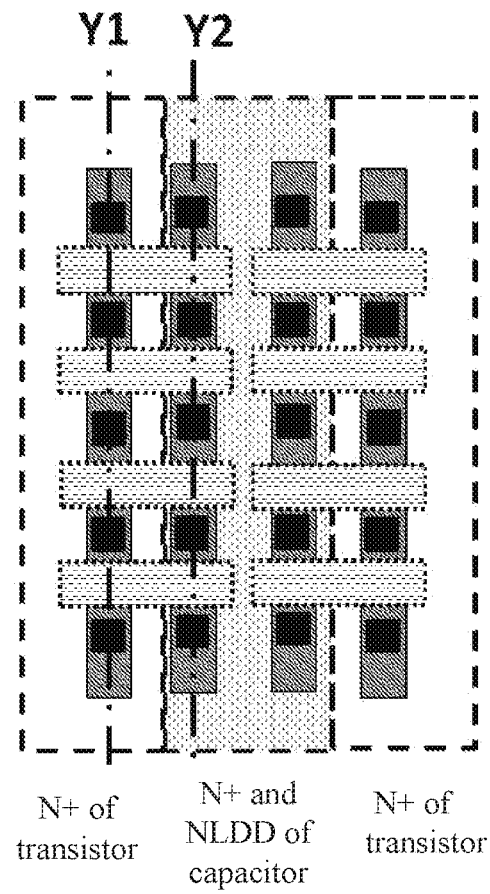
FIG. 5 shows the layout of a capacitor-coupled N-type transistor-based OTP device constructed in accordance with the present invention.
Figure 6:
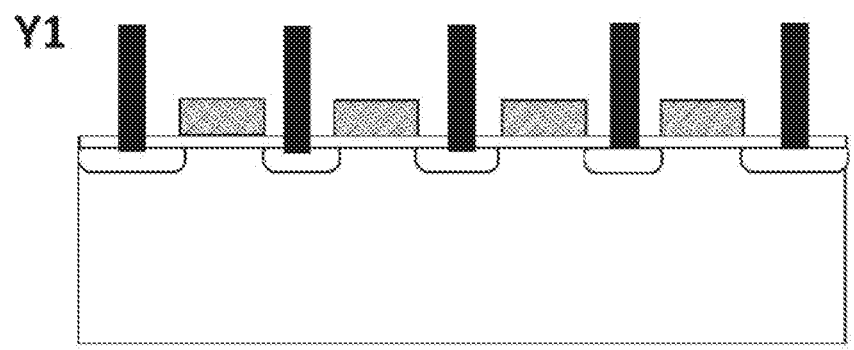
FIG. 6 is a cross-sectional view taken along the line Y1 in FIG. 5.
Figure 7:
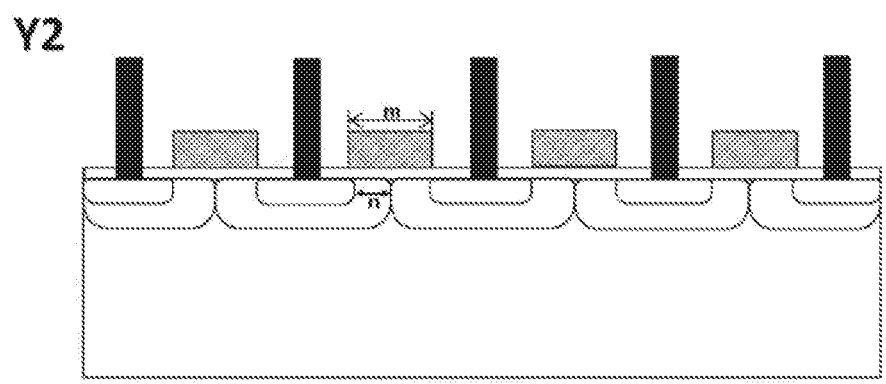
FIG. 7 is a cross-sectional view taken along the line Y2 in FIG. 5.

FIG. 5 shows the layout of an OTP device embodying the present invention, in which two directions Y1 and Y2 are shown. FIG. 6 is a cross-sectional view taken along the line Y1 in FIG. 5, showing a column of transistors. FIG. 7 is a cross-sectional view taken along the line Y2 in FIG. 5, showing a column of coupling capacitors. As shown in FIG. 7, in order to maximize capacitance utilization efficiency, the top plate of the coupling capacitor may have a width m that is not greater than twice an overlapping lateral width n of the NLDD region and an overlying gate (n also could be understood as twice a lateral junction depth of the heavily-doped N-region).

As shown in FIG. 4, in order to achieve an optimized capacitance coupling ratio of the coupling capacitor to the transistor, the gate of the transistor may not be wider than the top plate of the coupling capacitor.

An ion-implantation process for forming the heavily-doped N-region in the transistor may involve an N-type implantation in a direction pointing toward the gate region and being inclined at an angle of 15 to 45 degrees with respect to the vertical direction, which ensures an effective connection between the source and drain regions, and optimizes a hot carrier writing efficiency.

The OTP device of the present invention may be fabricated using a process including the steps of:

1. defining an active region by a LOCOS or STI process;
2. forming the P-well, as well as an N-well for the remaining circuit part, by photolithography and ion-implantation;
3. depositing polysilicon on the substrate surface, and forming the polysilicon gate of the transistor and the top plate of the coupling capacitor by photolithography and plasma etching, wherein the gate and the top plate are formed by a single etching process;
4. forming the NLDD region of the coupling capacitor by photolithography and ion implantation, wherein the NLDD implantation is only applied to the area of the bottom plate of the coupling capacitor but not applied to the area of the transistor;
5. forming a spacer in a CMOS device in the circuit;
6. forming heavily-doped N-regions by photolithography and ion implantation, such that heavily-doped N-regions are formed both in the source and drain regions of the transistor and in the bottom plate of the coupling capacitor;
7. forming a heavily-doped P-region by photolithography and ion implantation, which serves for external connection of the P-well, and performing source and drain doping for other PMOS devices in the circuit;
8. forming a silicide; and
9. forming back-end interconnections and a passivation layer by using CMOS process and ending this fabrication process.

While the invention has been described above with reference to several preferred embodiments, its scope is in no way limited to these embodiments. For those skilled in the art, various modifications and changes are also possible to the invention. Any and all variations, equivalent substitutions, modifications and the like made without departing from the spirit and scope of the present invention are intended to be embraced within the scope thereof.

What is claimed is:

1. A capacitor-coupled N-type transistor-based one-time programmable (OTP) device, comprising a transistor and a coupling capacitor both located in a P-well and isolated from each other by a field oxide or a shallow trench isolation, the transistor comprising a gate, a source region and a drain region, the source and drain regions each composed of a heavily-doped N-region, the coupling capacitor having a top plate formed by a polysilicon on a substrate surface, and a bottom plate composed of an NLDD implantation region and a heavily-doped N-region in the NLDD implantation region, wherein the heavily-doped N-region of the transistor is not surrounded by an NLDD implantation region, and
wherein the bottom plate of the coupling capacitor is directly formed in the P-well, and the NLDD implantation region of the capacitor has a depth slightly greater than a depth of the source and drain regions of the transistor and smaller than a depth of the field oxide or shallow trench isolation.

2. The OTP device of claim 1, wherein the gate of the transistor and the top plate of the coupling capacitor are formed by etching a same polysilicon layer.

3. The OTP device of claim 1, comprising a plurality of cells arranged in an array, each cell comprising one transistor and one corresponding coupling capacitor, wherein in every two adjacent ones of the cells, the bottom plates of the coupling capacitors are independent from each other.

4. The OTP device of claim 1, comprising a plurality of cells arranged in an array, each cell comprising one transistor and one corresponding coupling capacitor, wherein in every two adjacent ones of the cells, active regions of the coupling capacitors are joined together.

5. The OTP device of claim 1, wherein the top plate of the coupling capacitor has a width not greater than twice an overlapping lateral width of the NLDD implantation region and an overlying gate so that a capacitance utilization efficiency is maximized.

6. The OTP device of claim 1, wherein the gate of the transistor has a width not greater than a width of the top plate of the coupling capacitor so that a capacitance coupling ratio of the coupling capacitor to the transistor is optimized.

7. The OTP device of claim 1, wherein an ion-implantation process for forming the heavily-doped N-region comprises an implantation of N-type ions conducted at an inclination angle of 15 to 45 degrees to form an effective connection between the source and the drain as well as to optimize a hot carrier writing efficiency.

* * * * *